United States Patent [19]
Böhme

[11] Patent Number: 4,937,534
[45] Date of Patent: Jun. 26, 1990

[54] BAND-PASS AMPLIFIER

[75] Inventor: Rolf Böhme, Bad Friedrichshall, Fed. Rep. of Germany

[73] Assignee: Telefunken Electronic GmbH, Heilbronn, Fed. Rep. of Germany

[21] Appl. No.: 327,513

[22] Filed: Mar. 22, 1989

[30] Foreign Application Priority Data

Apr. 16, 1988 [DE] Fed. Rep. of Germany ....... 3812711

[51] Int. Cl.$^5$ .............................................. H03F 3/45
[52] U.S. Cl. .................................... 330/252; 330/261
[58] Field of Search ................ 330/252, 257, 259, 261, 330/302, 306, 296

[56] References Cited

U.S. PATENT DOCUMENTS

Re. 32,479  8/1987  Böhme ................................. 330/261
4,547,744  10/1985  Kasperovitz ......................... 330/261

FOREIGN PATENT DOCUMENTS 1142633  1/1963  Fed. Rep. of Germany ...... 330/252

Primary Examiner—Steven Mottola
Attorney, Agent, or Firm—Spencer & Frank

[57] ABSTRACT

In a band-pass amplifier having differential stage comprising two transistors fed from a joint current source, the collector of the first transistor is connected via a resistor to the base of a third transistor complementary to the first and second transistor, and the collector of the second transistor is connected via a resistor to the base of a fourth transistor complementary to the first and second transistor. The emitters of the third transistor and fourth transistor are connected to a supply voltage source, and the collectors of the third and of the fourth transistor form the output terminals of the amplifier.

14 Claims, 3 Drawing Sheets 4,937,534

BAND-PASS AMPLIFIER

BACKGROUND OF THE INVENTION

The invention relates to a band-pass amplifier having a differential stage comprising two transistors fed from a joint current source.

The invention is concerned in particular with an elementary differential amplifier stage for intermediate and high frequency amplifiers which is used particularly in bipolar integrated circuits. The invention represents a contribution to overcoming two fundamental difficulties with bipolar integrated high-frequency amplifiers, namely the unwelcome direct current amplification and the unwelcome wideband nature of such amplifiers.

A known solution to the above problems is indicated in the Dutch patent 8003197. In the known circuit a differential stage comprising a power source and a first and second bipolar transistor is combined with a cross-coupled circuit comprising a third and fourth bipolar transistor of identical conductivity type. The collector of the first transistor is connected to the emitter of the third transistor, and the collector of the second transistor is connected to the emitter of the fourth transistor, the connection points doubling as the outputs of the circuit. The collectors of the third and fourth transistors are connected via a first and a second resistor to a supply voltage. In addition, the collector of the third transistor is connected via a third resistor to the base of the fourth transistor, and the collector of the fourth transistor via a fourth resistor to the base of the third transistor. The first and the second resistors are so dimensioned that the D.C. voltage amplification of the circuit is approximately zero. The third and the fourth resistors are used to set the required resonance frequency.

While this circuit has favourable properties in the high frequency range, e.g. in intermediate frequency amplifiers for TV receivers, its use in intermediate frequency amplifiers for radio is more difficult. The above circuit, in that case provides relatively high values for the third and fourth resistors, to the detriment of operating point stability.

SUMMARY OF THE INVENTION

The object underlying the invention is to provide a circuit which can also be used for lower frequencies. According to the invention, there is provided a band-pass amplifier having a differential stage of two transistors, in which the collector of the first transistor is connected via a resistor to the base of a third transistor complementary to the first and second transistor, and the collector of the second transistor is connected via a resistor to the base of a fourth transistor complementary to the first and second transistor. The emitters of the third transistor and fourth transistor are connected to a supply voltage source and the collectors of the third and of the fourth transistor form the output terminals of the amplifier.

BRIEF DESCRIPTION OF THE DRAWINGS

The invention will be described now in greater detail, by way of examples, with reference to the drawings, in which.

DESCRIPTION OF THE PREFERRED EMBODIMENTS

Figure 1:
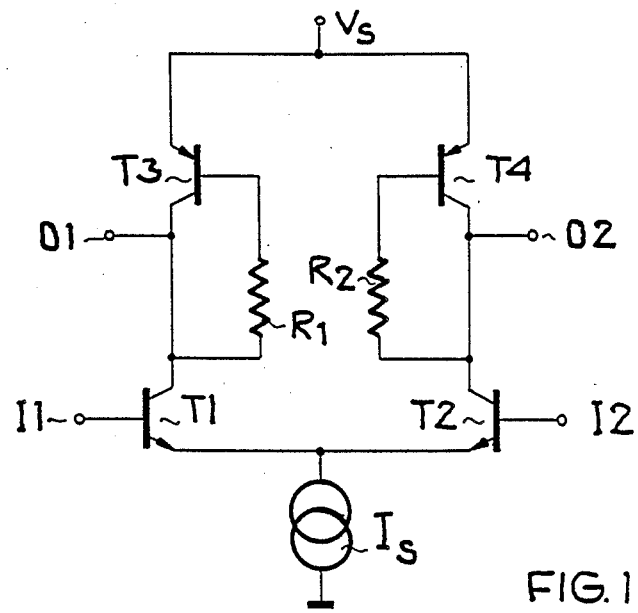
FIG. 1 is a basic circuit diagram of one embodiment according to the invention.
Figure 2:
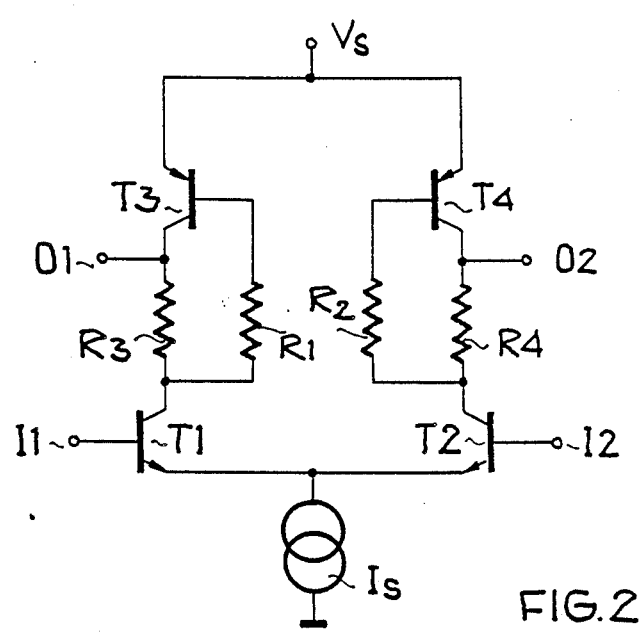
FIG. 2 is a modified circuit diagram of the invention for compensation of the direct current amplification.

FIG. 1 shows a band-pass amplifier of the invention in its simplest form. It is based on a conventional differential stage comprising transistors T1, T2, whose base connections form the input I1, I2 of the circuit and whose emitters are connected to a current source Is. The collector of the first transistor T1 is connected via a resistor R1 to the base of a third transistor T3. In the same way, the collector of the second transistor T2 is connected via a second resistor R2 to the base of a fourth transistor T4. The conductivity type of the third and fourth transistors is complementary to the conductivity type of the first and second transistors. The collectors of the third transistor T3 and of the fourth transistor T4 form the outputs of the circuit. The outputs of the circuit are connected directly to the collectors of the first and second transistor or via a third and fourth resistor R3 and R4 respectively in accordance with FIG. 2.

In a preferred embodiment the transistors T1, T2 of the differential stage are vertical npn-transistors having a high operating speed, and transistors T3, T4 are lateral pnp-transistors with considerably lower operating speed. For the description of the mode of operation it may be assumed that at low frequencies the resistances R1, R2 are small compared with the input resistance of the associated transistors T3, T4. The transistors T3, T4 then act as simple diodes with regard to the operating currents of the transistors in the differential stage. The amplification of the circuit shown in FIG. 1 has approximately the value 1. If this low amplification is disturbed, resistors R3, R4 introduced in FIG. 2 enable a compensation to zero by these resistors being made equal or approximately equal to the reciprocal value of the mutual conductance of the transistors T1, T2 of the differential stage. With increasing frequency the input resistance of the transistors T3, T4 decreases and a voltage divider is formed via the resistor R1 or the resistor R2 and the input impedance of the associated transistors T3, T4. This voltage division has the nature of a low pass. The falling input voltage causes a growing inductive impedance of the collector connection. This leads to an amplification that increases with the frequency. In the borderline case, the base input voltage of transistors T3, T4 drops to zero and the amplification of the differential stage is determined solely by the mutual conductance of its transistors and by the resistor R1, R2. This case can however not be reached entirely, since there are also parasitic capacitances apart from the resistances, and since the relationship of the operating speeds of the two transistor types cannot be as great as desired. Further increasing frequency therefore leads to a decrease in amplification and overall to the characteristics of a not very selective band pass filter.

Figure 3:
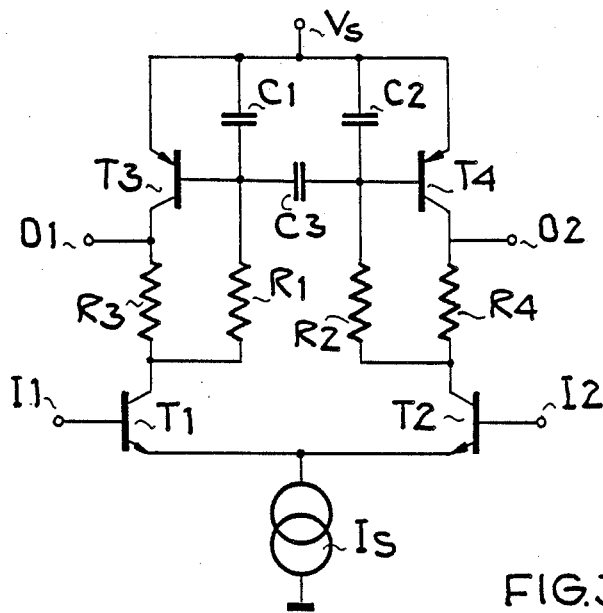
FIG. 3 shows a capacitance circuit arrangement of the embodiment of FIG. 2 that reduces the frequency range.

The inductive component of the impedance of transistors T3, T4 is increased, and the lower limit frequency thereby decreased when the base connection is subjected to a capacitive load. FIG. 3 shows two possibilities for this. One possibility is to connect one capacitor C1, C2 each to one base each of transistor T3, T4 and then to connect each capacitor to a reference electrode, the supply voltage Vs or a ground connection. Since lateral transistors by their very nature already have a marked capacitance between base and substrate, these capacitances can also be achieved by enlarging the base zone. Finally, it is possible to connect a potential-free capacitor C3 to the bases of transistors T3, T4, with the same effect being achieved with half of the of capacitors C1, C2.

Figure 4:
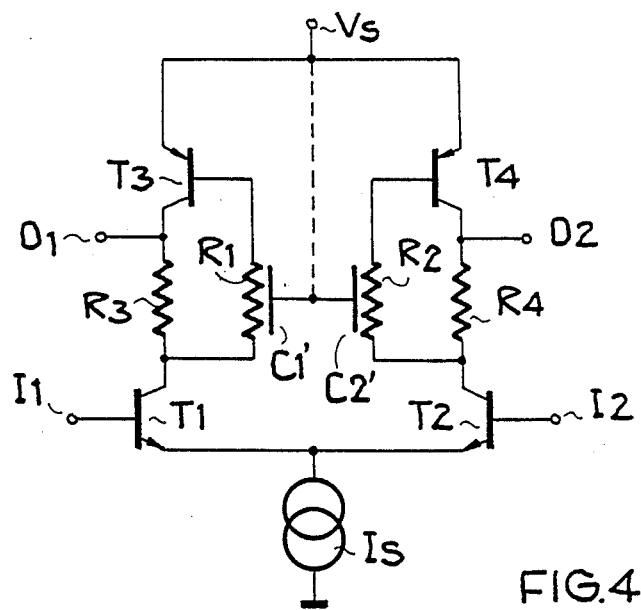
FIG. 4 illustrates the exploitation of the capacitance layer of integrated resistors R1, R2 of the embodiment of FIG. 2.

A further variant which is particularly apt for bipolar integration technology is the exploitation of the capacitance layer of the resistors R1, R2 as shown in FIG. 4. The resistor between the collector of transistors and the base of transistors T3, T4 thereby becomes a frequency-dependent two-port element with low-pass characteristics that supports the low-pass effect of the input capacitance of transistors T3, T4. Since a phase turn of more than 90° is possible with these elements, narrow-band band pass filters can also be implemented.

Figure 5:
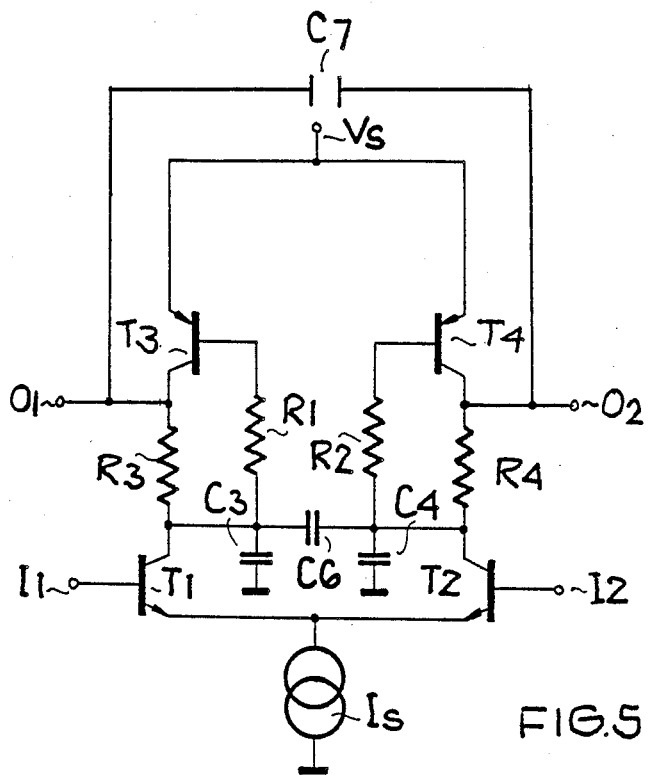
FIG. 5 is a second modified circuit diagram of FIG. 2 showing an output-side capacitance circuit arrangement

If the circuit components formed from transistors T3 and T4 and their associated resistances and possible capacitances are considered as working resistances of transistors T1, T2 in the differential stage, these working resistance are frequency-dependent, with the frequency dependence corresponding to an inductance connected with resistances. This property can be used to generate lower resonance frequencies and narrower band widths by connection of capacitors C3, C4 to the outputs O1, O2 of the circuit. Since the values of the compensation resistors R3, R4—where provided— are relatively low, the connection can just as well as be made at the collectors of the first and second transistors, as shown in FIG. 5. Instead of two single capacitors C3, C4, which are connected to a reference point, a single capacitors C6 can also be provided which is connected directly to the collectors of the transistors T1, T2. Alternatively, a single capacitor C7 could be connected directly to outputs O1, O2, instead of or in addition to capacitor C6.

Figure 6:
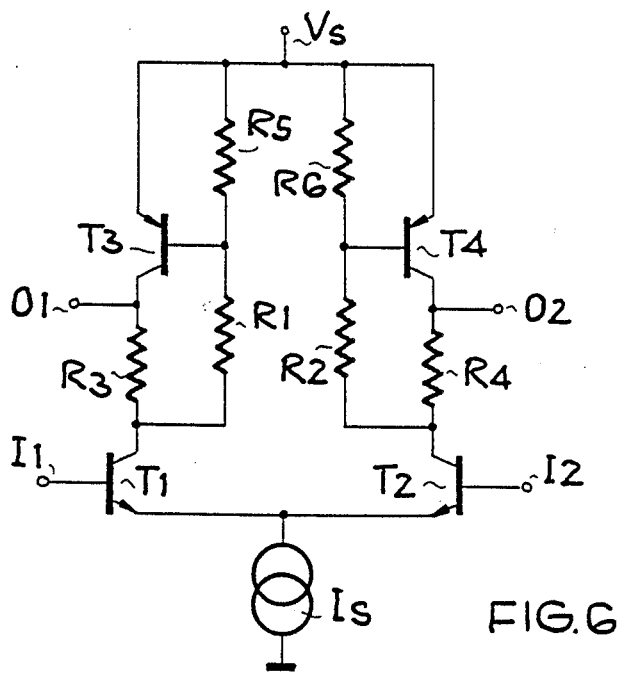
FIG. 6 is a third modified circuit diagram for increasing the voltage swing capability in the embodiment of FIG. 2.

In all previously considered circuits, the potential of output O1 or O2 is located near the base potential of the associated transistor T3, T4 respectively. The voltage swing capability is thereby restricted to relatively low values. There are various methods of increasing the voltage swing capability. For example, it is possible, as shown in FIG. 6, to generate an additional voltage drop and thereby increase the permissible voltage lift via the resistor R1, R2 by adding an additional resistor R5 or R6 which is connected to the base of the third transistor T3 or to the base of the fourth transistor T4 respectively, and which is connected in each case to the associated emitter.

What is claimed is:

1. A band-pass amplifier comprising a differential stage which comprises a first transistor and a second transistor fed from a joint current source, wherein the emitters of the first and second transistors are connected to the joint current source, the collector of the first transistor is connected via a resistor to the base of a third transistor complementary to the first and second transistor, and the collector of the second transistor is connected via a resistor to the base of a fourth transistor complementary to the first and second transistor, wherein the emitters of the third transistor and fourth transistor are connected to a supply voltage source, and wherein the collectors of the third and of the fourth transistor form the output terminals of the amplifier.

2. A band-pass amplifier according to claim 1, wherein the collectors of the first and second transistors are connected to the output terminals.

3. A band-pass amplifier according to claim 1, wherein a resistor is connected between the collector of the first transistor and the first output, and a resistor between the collector of the second transistor and the second output.

4. A band-pass amplifier according to claim 1, wherein the third transistor and fourth transistor are lateral transistors.

5. A band-pass amplifier according to claim 1, wherein the bases of the third transistor and of the fourth transistor are connected with one capacitance each to the supply voltage source.

6. A band-pass amplifier according to claim 1, wherein the base of the third transistor and of the fourth transistor has an inherent capacitance which is increased by enlarging the base zone of the respective transistor.

7. A band-pass amplifier according to claim 1, wherein a capacitance is connected between the bases of the third transistor and of the fourth transistor.

8. A band-pass amplifier according to claim 1, wherein the resistors have a capacitance layer facing opposite a voltage supply source reference electrode.

9. A band-pass amplifier according to claim 1, wherein the outputs of the collectors of the first transistor and of the second transistor are connected with one capacitance each to a reference electrode.

10. A band-pass amplifier according to claim 1, wherein a capacitance is connected between the collectors of the first and second transistor.

11. A band-pass amplifier according to claim 1, wherein one resistor each is connected between the bases of the third and fourth transistors and the supply voltage source.

12. A band-pass amplifier according to claim 1, wherein the bases of the third and fourth transistors are connected with one capacitance each to a ground connection.

13. A band-pass amplifier according to claim 1, wherein the output terminals of the amplifier are connected with one capacitance each to a reference electrode.

14. A band-pass amplifier according to claim 1, wherein a capacitance is connected to the output terminals of the amplifier.

* * * * *